United States Patent [19]

Sigmon

[11] Patent Number: 4,961,058
[45] Date of Patent: Oct. 2, 1990

[54] FEEDBACK STABILIZATION LOOP
[75] Inventor: Bernard E. Sigmon, Tempe, Ariz.
[73] Assignee: Motorola, Inc., Schuamburg, Ill.
[21] Appl. No.: 354,575
[22] Filed: May 22, 1989
[51] Int. Cl.$^5$ .......................... H03L 7/06; H03B 9/01
[52] U.S. Cl. .......................................... 331/9; 331/5; 331/6; 331/82; 331/83; 331/88; 331/175
[58] Field of Search .................... 331/1 R, 5, 6, 7, 55, 331/9, 74, 77, 82, 83, 172, 88, 175; 315/39.51, 39.53

[56] References Cited
FOREIGN PATENT DOCUMENTS
0105406 8/1980 Japan ...................................... 331/77

Primary Examiner—David Mis
Attorney, Agent, or Firm—Jordan C. Powell; Eugene A. Parsons

[57] ABSTRACT

Stabilizing a signal generating source by coupling a small amount of the output power through a bandpass filter tuned to the desired frequency and injecting the power back into the source. In another embodiment the filtered power may be increased by injection locking a smaller oscillator and using the output to stabilize the source, or the filtered power may be amplified in a reflection amplifier and injected into the source for stabilization.

12 Claims, 4 Drawing Sheets

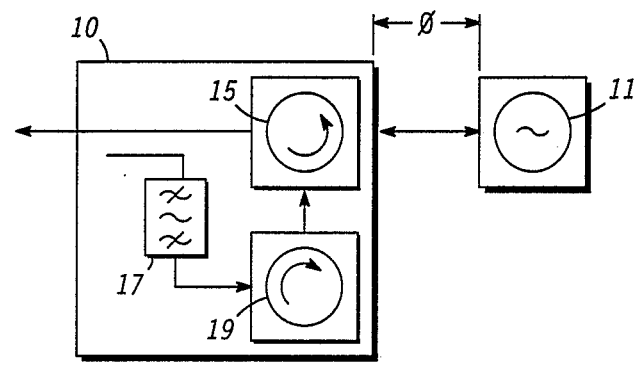
FIG. 1
FIG. 4
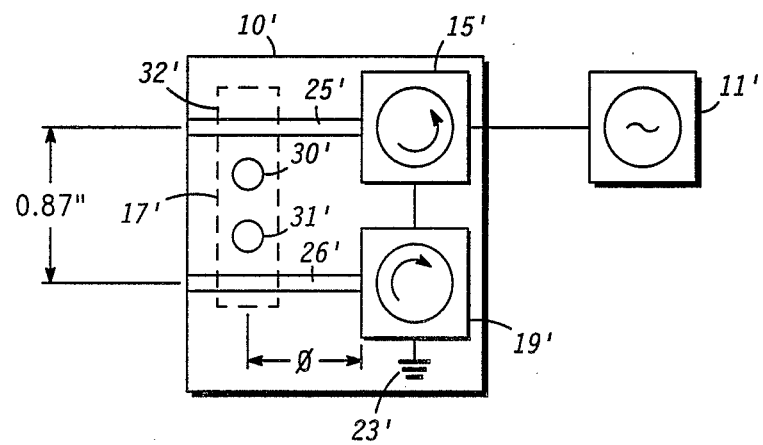

FEEDBACK STABILIZATION LOOP

FIELD OF THE INVENTION

The present invention pertains to apparatus for stabilizing a signal generating source and more particularly to a feedback stabilization loop for stabilizing high power oscillators, such as magnetrons, klystrons, traveling-wave-tubes, solid state oscillators, and the like.

BACKGROUND OF THE INVENTION

High power oscillators, and especially the magnetron, suffer from lack of frequency stability due to temperature and pulse repetition frequency (PRF) changes. In many applications such oscillators are pulsed, or produce a burst of signals at an operating frequency each time a pulse is applied. It is important that the operating frequency remain constant when the frequency of the applied pulses is varied or when the operating temperature varies. In many instances the instability is so severe the source is out of specification and must be discarded.

In general, prior art stabilization consists of using phase locked loops or injection locking the oscillator to a stable reference source. Injection locking is complex and requires considerable power consumption and is, therefore, very expensive. Phase locked loops are the most technically complex, requiring the most area and the greatest number of components, and are, therefore, the most expensive.

SUMMARY OF THE INVENTION

It is an object of the present invention to provide new and improved apparatus for stabilizing a signal generating source.

It a further object of the present invention to provide a feedback stabilization loop for high power oscillators and the like which is smaller, simpler and cheaper than prior art stabilizing apparatus.

These and other objects of this invention are realized in a feedback stabilization loop for a signal generating source including a circulator having a bandpass filter coupled to receive a portion of the output thereof and an isolator coupling the output of the bandpass filter to an input of the circulator. Another input of the circulator is coupled to the output of the source to be stabilized so as to present to the source an impedance locus which will substantially prevent changes in frequency in the output frequency of the source. The output of the circulator is the stabilized output frequency of the apparatus and the portion filtered and returned to the circulator is injected back into the source by the circulator for stabilization.

In another embodiment, a second circulator is coupled between the filter output and isolator. The second circulator has an input coupled to the output of the filter, an output coupled to the isolator and a second input with a reflection amplifier or an injection locked oscillator coupled thereto. This provides additional stability and/or feedback power.

BRIEF DESCRIPTION OF THE DRAWINGS

Referring to the drawings:

FIG. 1 is a simplified block diagram of a feedback stabilization loop, attached to a signal generating source, embodying the present invention;

FIG. 4 is a specific embodiment of the feedback stabilization loop of FIG. 1;

DESCRIPTION OF THE PREFERRED EMBODIMENTS

Figure 2:
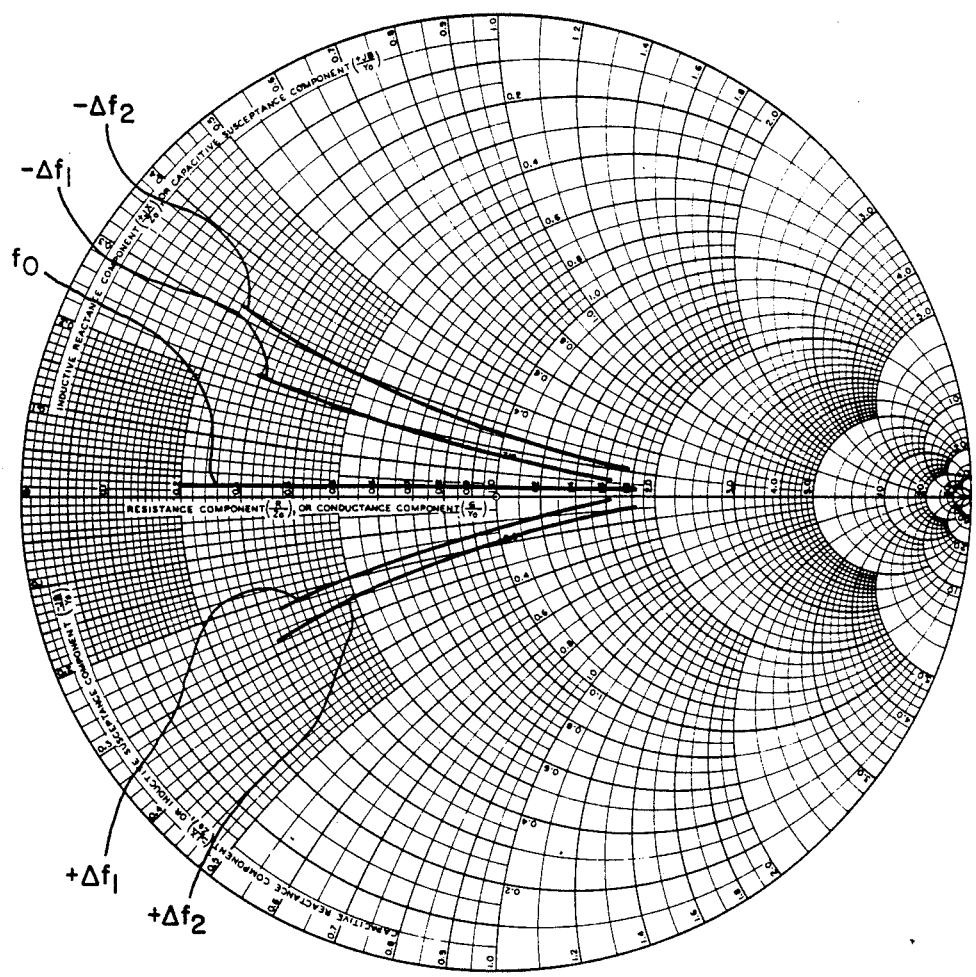
FIG. 2 is a graphical representation of a plurality of load versus constant frequency curves for the signal generating source of FIG. 1.

Referring specifically to FIG. 1, a simplified block diagram of a feedback loop 10 attached to the output of a signal generating source 11 is illustrated. Feedback loop 10 includes a circulator 15, a bandpass filter 17 and an isolator 19. Circulator 15 has first and second ports and an output port, and is constructed so that at least a portion (generally, as much as possible) of signals at a desired operating frequency applied to the second port are outputted from the first port. The first port of circulator 15 is coupled to the output of source 11. The input of bandpass filter 17 is coupled to receive a portion of the signals available at the output port of circulator 15, with the remainder of the output signals from circulator 15 going to a load of the apparatus. This partial coupling is accomplished, in this embodiment, by an inductive coupler 21, which can be constructed to pick-off as much of the output signal as is desired by changing the amount of inductive coupling. Bandpass filter 17 is tuned to the desired operating frequency of source 11 and the output thereof is coupled to an input of isolator 19. Isolator 19 may be, for example, a device similar to circulator 15 with one input unused. The output of isolator 19 is supplied to the second port of circulator 15. Thus, the portion of the signals produced by source 11 which is picked-off by inductive coupler 21 and which is passed by filter 19 is injected back into source 11 to control the operating frequency thereof.

FIG. 2 illustrates, on a Smith Chart, a plot of constant frequency curves from a range of loads on signal generating source 11. These curves were obtained by operating source 11, which in this example was a magnetron with feedback stabilization loop 10 not attached, into a range of loads. From this operation, frequencies were measured which resulted in the generation of the constant frequency curves of FIG. 2. It should be noted that all of the constant frequency curves above the line marked Of (the desired operating frequency) are negative in sign. This means that any impedance which lies on the curve will cause a downward shift in frequency by an amount Δf. Conversely, a positive shift in frequency will be caused by the impedance loci which make up the curves located below the line Fo.

Figure 3:
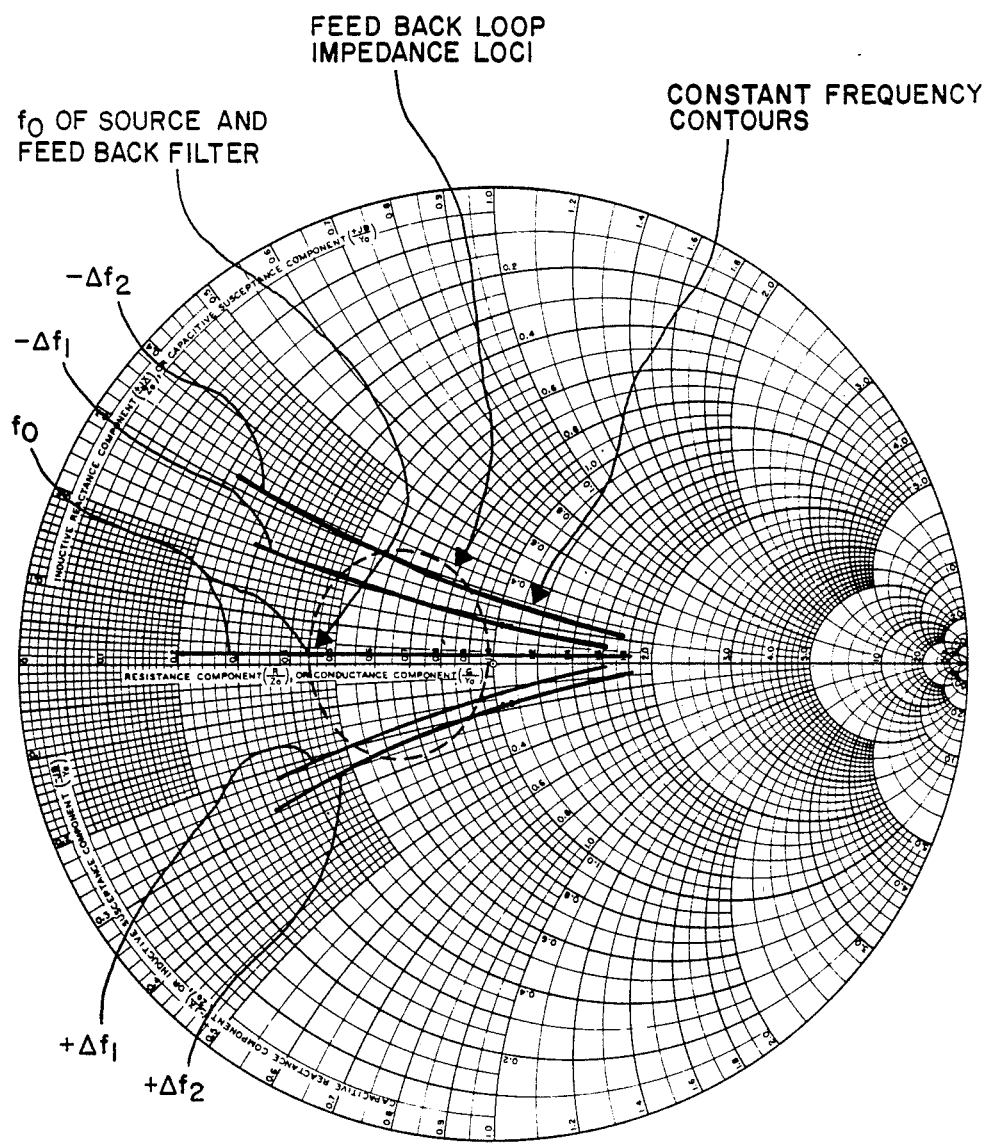
FIG. 3 is a graphical representation of impedance loci presented to the signal generating source of FIG. 1 by the feedback stabilization loop of FIG. 1.

FIG. 3 illustrates the impedance loci presented to source 11 by feedback stabilization loop 10. The impedance loci is superimposed on the curves of FIG. 2 to illustrate the relation therebetween. It should be noted that the direction of increasing frequency of the superimposed impedance loci is in a direction which is in opposition to the impedance required by source 11 for a frequency shift to occur. Thus, feedback stabilization loop 10 stabilizes the output frequency of signal generating source 11.

Feedback stabilization loop 10 will achieve an effective lock range (operating range) that is mathematically described by Adler's locking range equation described in detail in "A study of locking phenomena in oscillators", by R. Adler, Proceedings of the IRE, Vol.34, pp.351–357, June 1946. That is:
$\Delta F = F/(2Q)(\sqrt{Pinj/Pout})$ Where:
$\Delta F$ = the frequency difference between the frequency passed by the cavity and the frequency of the free running source.
F = the frequency of the free running source.
Pinj = power injected into the source by the feedback path.
Pout = the source's free running power output.
Q = the quality factor of the free running source.

Referring to FIG. 4, a specific embodiment of the feedback stabilization loop of FIG. 1 is illustrated. In this embodiment like parts are designated with like numbers having a prime added to indicate the specific embodiment. Circulator 15' is a ferrite circulator, well known by those skilled in the art. Also, isolator 19' is a similar device with one port terminated in its characteristic impedance 23'. Thus, in both circulator 15' and isolator 19' only the desired frequency is passed to the output port. The desired frequency is conducted to an output of feedback stabilization loop 10' and to bandpass filter 17' by a microstrip transmission line 25'. Also, the desired frequency is conducted from bandpass filter 17' to the input of isolator 19' by a microstrip transmission line 26'. In this embodiment, microstrip transmission lines 25' and 26' and circulator/isolator 15'/19' are formed by first selecting a rectangular piece of insulating material having appropriate size, thickness and electrical properties. A ground plane is formed by covering the bottom of the selected piece (not shown) with a conductor, such as copper or the like. The components are then formed by placing conductors, such as copper, in appropriate positions and shapes on the upper surface of the piece of insulating material.

A high-Q bandpass filter 17' is constructed by placing dielectric resonators 30' and 31' adjacent to microstrip transmission lines 25' and 26' and adjacent to each other. A portion of the ground plane, illustrated by broken line 32', is removed from the insulating piece below and adjacent to dielectric resonators 30' and 31' so as not to interfere with the operation thereof. As is well known in the art, dielectric resonators operate similar to a tuned cavity and are relatively easily constructed to resonate at the desired frequency. Further, energy at the desired frequency is coupled from microstrip transmission line 25' to dielectric resonator 30', with the amount of coupling, and the Q, being determined by the proximity of dielectric resonator 30' to microstrip transmission line 25'. Similarly, energy at the desired frequency is coupled from dielectric resonator 31' to microstrip transmission line 26', and in each instance of coupling the proximity of the components determines the Q. The amount of Q selected depends upon the desired stability, with the stability increasing as the Q increases. However, high Q requires less coupling and, therefore, the apparatus requires more power to operate. In the present embodiment it was found that a Q of approximately ten thousand produced good operating characteristics. Also, in this embodiment dielectric resonators 30' and 31' are constructed of bariumtetratitanate to provide temperature stability.

Dielectric resonators 30' and 31' are, in this embodiment, frequency versus temperature stable. Further, the specific material forming the various components, the coupling and the length and size of microstrip transmission lines 25' and 26' determine the impedance loci, illustrated in FIG. 3. Thus, the embodiment is a high-Q bandpass filter including dielectric resonators, which are frequency versus temperature stable, in conjunction with ferrite circulators/isolators to feed back part of the energy from the frequency generating source to be stabilized in such a manner as to present an impedance locus to the source which counteracts any tendency of the source to change frequency. It will of course be understood by those skilled in the art that the dielectric resonators could be replaced with tuned cavities, however, the simplicity of the present embodiment is apparent.

Figure 5:
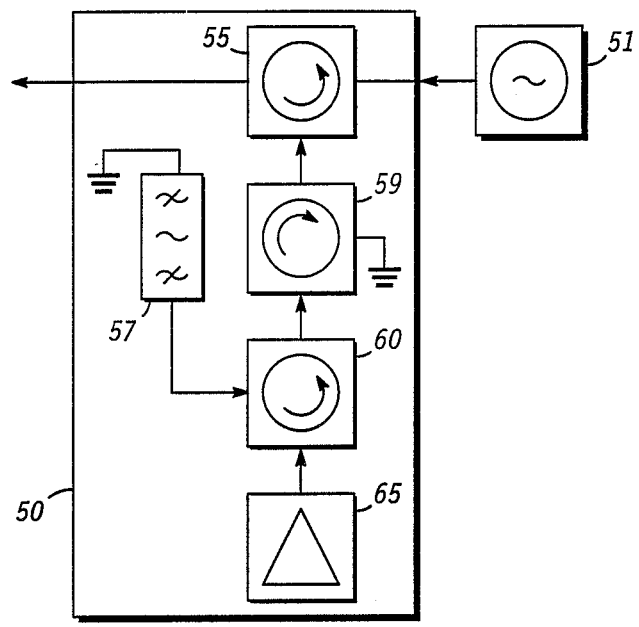
FIG. 5 is another variation of a feedback stabilization loop, attached to a signal generating source, embodying the present invention.

Referring to FIG. 5, another feedback stabilization loop 50 is illustrated, which embodies the present invention. Feedback stabilization loop 50 is coupled to the output of a signal generating source 51 and includes a circulator 55, a bandpass filter 57, and isolator 59, a second circulator 60 and an injection oscillator/reflection amplifier 65. Basically, the components are coupled the same as the components in feedback stabilization loop 10, except that circulator 60 is coupled between the output of bandpass filter 57 and the input of isolator 59. The second port of circulator 60 is coupled to the output of bandpass filter 57, the first port is coupled to an input/output of injection oscillator/reflection amplifier 65 and the output port is coupled to an input of isolator 59. Circulator 60 operates similar to circulator 55 in that some of the energy applied to the second port, at the predetermined frequency, will be outputted from the first port (applied to injection oscillator/reflection amplifier 65). Thus, an injection oscillator will receive energy from bandpass filter 57 at the desired frequency and will send a relatively strong signal at the desired frequency, through circulator 60, isolator 59, and circulator 55 to magnetron 51. Similarly, if a reflection amplifier is used, it will amplify the energy outputted by bandpass filter 57 and supply it to magnetron 51 for locking. It should be noted that an injection oscillator will require a small amount of system power to operate. A reflection amplifier, which is basically an over-coupled oscillator, includes an active element, such as an IMPATT diode or the like, and is, therefore more complex and costly but can add power to the system.

Figure 6:
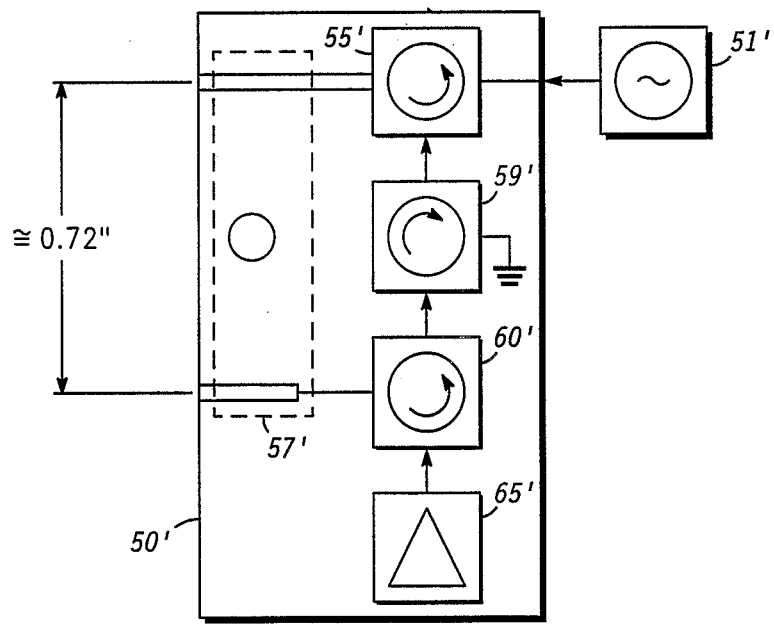
FIG. 6 is a specific embodiment of the feedback stabilization loop of FIG. 5.

FIG. 6 illustrates a specific embodiment of feedback stabilization loop 50, wherein the components are generally similar to the components of FIG. 4. In this illustration similar parts are designated with similar numbers having a prime added to indicate the specific embodiment. In this specific embodiment, injection oscillator/reflection amplifier 65 is an IMPATT diode reflection amplifier 65', which is constructed as a portion of one arm of circulator 60'. Reflection amplifier 65' has a gain of approximately 10db. Thus, amplified energy from source 51' is fed back into source 51' at the frequency chosen by high-Q bandpass filter 57' (the desired operating frequency).

It is not immediately obvious but if a pulsed source (magnetron 51') is used, a wider locking range then predicted by theory (see the above equation) is achieved. This is primarily due to the fact that the RF energy in the sidelobes can be passed by the bandpass filter, amplified and used to pull-in the source to be locked. That is, the sideband energy (if the main lobe is outside the locking range) begins a feedback pull-in operation that, due to the injection locking phenomena, brings the main lobe closer to the bandpass filter frequency, thus, inducing more energy into the source to be locked, which then in turn speeds the locking phenomena, i.e., a regenerative feedback.

The time to achieve lock, in the embodiment of FIG. 5, is significantly reduced if signal generating source 51 and injection oscillator/reflection amplifier 65 are turned on simultaneously. That is, the worst case time to lock is given by:

$$\Delta t = Q/f(\sqrt{Po/Pi})$$

Where: $\Delta t$=locking time if the phase difference between source 51 and the reference signal is 180 degrees.
f=operating frequency.
Q=quality factor of source 51.
Po=RF power of source 51.
Pi=RF power of injection oscillator/reflection amplifier 65.

Since the two sources (locking source and source to be locked) go from zero power to steady state together, the ratio under the radical in the above equation becomes a dynamic quantity, being quite small initially and taking on a larger value as the two units approach steady state. This initial small quantity reduces the $\Delta t$ and, in fact, in an operating version of the invention constructed similar to the embodiment illustrated in FIG. 6 an almost instantaneous lock time was achieved. Another observation of this operating version is that a phenomena known as frequency smearing can be used to advantage. Most sources frequency smear as they go from initial application of voltage to steady state operation. If the source is frequency set such that the direction of frequency smearing (pushing) is in a direction to insure coincidence with the tuned frequency of the high-Q bandpass filter (the desired frequency) then lock is also assured.

Thus, improved apparatus and methods are disclosed for stabilizing signal generating sources by utilizing small amounts of power from the source. The feedback stabilization loop may be constructed of all passive components but, in either embodiment, there are fewer components, smaller size, lower cost and, in the case of high power sources, it makes possible the stabilization of sources that were not technically capable of being locked before due to the absence of any stable reference sources with sufficient levels of output power to insure an adequate locking range. The present invention not only offers frequency versus temperature stability but also improves the fm noise and spectrum purity of sources who's zeros are lower in value then the zeros of the bandpass filter.

While I have shown and described specific embodiments of the present invention, other improvements and modifications may occur to those skilled in the art. I desire it to be understood, therefore, that this invention is not limited to the particular forms shown and I intend in the appended claims to cover all modifications which do not depart from the spirit and scope of this invention.

What I claim is:

1. A feedback stabilization loop for a signal generating source having an output;
    a circulator having first and second ports and an output port, and constructed so that signals supplied to the second port are at least partially outputted from the first port;
    a bandpass filter having an input, coupled to receive a portion of any output signals at the output port of said circulator, and an output;
    an isolator having an input and an output said output of said isolator coupled to said second port of said circulator;
    reference signal generating means including an input coupled to the output of said bandpass filter, and an output coupled to the input of said isolator; and
    the first port of said circulator being coupled to the output of said signal generating source for presenting to said signal generating source an impedance locus which will substantially prevent changes in frequency in the output of said signal generating source.

2. A feedback stabilization loop for a signal generating source as claimed in claim 1 wherein the signal generating source is selected from a group comprising magnetrons, klystrons, and traveling-wave-tubes.

3. A feedback stabilization loop for a signal generating source as claimed in claim 1 wherein the bandpass filter includes a dielectric resonator.

4. A feedback stabilization loop for a signal generating source as claimed in claim 1 wherein the bandpass filter is constructed with a relatively high Q.

5. A feedback stabilization loop for a signal generating source as claimed in claim 3 wherein the circulator and isolator include a ferrite circulator and a ferrite isolator, respectively.

6. A feedback stabilization loop for a signal generating source as claimed in claim 1 wherein said reference signal generating means comprises:
    a second circulator having first and second ports and an output port
    the second port of said second circulator being coupled to the output of the bandpass filter and the output port being coupled to the input of the isolator; and
    an injection locked oscillator having an output coupled to the first port of said second circulator.

7. A feedback stabilization loop for a signal generating source as claimed in claim 6 wherein the second circulator is constructed so that signals supplied to the second port are at least partially outputted from the first port.

8. A feedback stabilization loop for a signal generating source as claimed in claim 1 wherein said reference signal generating means comprises:
    a second circulator having first and second ports and an output port;
    said second port being coupled to the output of the bandpass filter and the output port coupled to the input of the isolator; and
    a reflection amplifier having an output coupled to the first port of said second circulator.

9. A feedback stabilization loop for a signal generating source as claimed in claim 8 wherein the second circulator is constructed so that signals supplied to the second port are at least partially outputted from the first port.

10. A method of stabilizing a signal generating source comprising the steps of:
    providing a signal generating source to be stabilized having an output;
    measuring the output of the signal generating source with a plurality of different loads, pulse repetition frequencies (PRFs), and temperatures;

determining a plurality of loci of constant frequency pulling curves from the measured outputs and, from the plurality of loci of constant pulling curves, determining a locus of impedance over temperature and PRF at the output of the signal generating source which gives the signal generating source an impedance required to minimize frequency drift;

constructing a feedback stabilization loop including a circulator having first and second ports and an output port and designed so that signals supplied to the second port are at least partially outputted from the first port, a bandpass filter having an input and an output, coupling means for coupling a portion of any output signals at the output port of said circulator to the input of said bandpass filter, an isolator having an input and an output coupled to the second port of said circulator, and reference signal generating means having an input coupled to the output of said bandpass filter and an output coupled to the input of the isolator; and coupling the output of the signal generating source to the first port of the circulator for presenting to said signal generating source an impedance locus which will substantially prevent changes in frequency in the output of said signal generating source.

11. A feedback stabilization loop to be attached to the output terminal of a signal generating source comprising:

a first circulator having first and second ports and an output port, said first circulator being constructed so that signals supplied to the second port are at least partially outputted from the first port;

a bandpass filter having an input, coupled to receive output signals at the output port of said first circulator, and an output;

an isolator having an output coupled to the second port of said first circulator and an input;

a second circulator having first and second ports and an output port, said second circulator being constructed so that signals supplied to the second port are at least partially outputted from the first port, the second port being coupled to the output of said bandpass filter and the output port being coupled to the input of the isolator, a reflection amplifier having an output coupled to the first port of said second circulator; and the first port of said first circulator being adapted to be coupled to the output of a signal generating source for presenting to the signal generating source an impedance locus which will substantially prevent changes in frequency in the output of said signal generating source.

12. A feedback stabilization loop as claimed in claim 11 wherein the reflection amplifier includes an IMPATT diode.

* * * * *